(12) United States Patent
Kim et al.

(10) Patent No.: US 8,754,517 B2
(45) Date of Patent: Jun. 17, 2014

(54) DOUBLE SIDE COOLING POWER SEMICONDUCTOR MODULE AND MULTI-STACKED POWER SEMICONDUCTOR MODULE PACKAGE USING THE SAME

(75) Inventors: Kwang Soo Kim, Gyunggi-do (KR); Young Ki Lee, Gyunggi-do (KR); Ji Hyun Park, Gyunggi-do (KR); Bum Seok Suh, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 170 days.

(21) Appl. No.: 13/532,362

(22) Filed: Jun. 25, 2012

(65) Prior Publication Data

US 2013/0270687 A1    Oct. 17, 2013

(51) Int. Cl.
*H01L 23/48*    (2006.01)

(52) U.S. Cl.
USPC ..... 257/690; 257/675; 257/706; 257/E23.001

(58) Field of Classification Search
USPC .......................... 257/690, E23.001, 675, 706
See application file for complete search history.

(56) References Cited

U.S. PATENT DOCUMENTS 6,432,750 B2    8/2002    Jeon et al.

*Primary Examiner* — Anthony Ho
(74) *Attorney, Agent, or Firm* — Ladas & Parry LLP

(57) ABSTRACT

Disclosed herein is a double side cooling power semiconductor module including: a first cooler having a concave part formed in one surface thereof in a thickness direction; a first semiconductor chip mounted on the concave part of the first cooler; a second cooler having one surface and the other surface and formed on one surface of the first cooler so that one surface thereof contacts the first semiconductor chip; a circuit board formed on the other surface of the second cooler; a second semiconductor chip mounted on the circuit board; and a flexible substrate having a circuit layer electrically connecting the first and second semiconductor chips to each other.

20 Claims, 3 Drawing Sheets

DOUBLE SIDE COOLING POWER SEMICONDUCTOR MODULE AND MULTI-STACKED POWER SEMICONDUCTOR MODULE PACKAGE USING THE SAME

CROSS REFERENCE TO RELATED APPLICATION

This application claims the benefit of Korean Patent Application No. 10-2012-0038479, filed on Apr. 13, 2012, entitled "Double Side Cooling Power Semiconductor Module and Multi-stacked Power Semiconductor Module Package using the Same", which is hereby incorporated by reference in its entirety into this application.

BACKGROUND OF THE INVENTION

1. Technical Field

The present invention relates to a double side cooling power semiconductor module and a multi-stacked power semiconductor module package using the same.

2. Description of the Related Art

In accordance with an increase in energy consumption around the world, an interest in efficient use of restricted energy has significantly increased.

In accordance with an increase in use of a power module, the market's demand for a power module having a multi-function and a small size has increased. Therefore, a heat generation problem of an electronic component has caused deterioration of performance of the entire module.

Therefore, in order to increase efficiency of the power module and secure high reliability thereof, a structure capable of solving the above-mentioned heat generation problem has been required.

Meanwhile, a power module package according to the prior art has been disclosed in U.S. Pat. No. 6,432,750.

SUMMARY OF THE INVENTION

The present invention has been made in an effort to provide a double side cooling power semiconductor module having maximized cooling efficiency, and a multi-stacked power semiconductor module package using the same.

Further, the present invention has been made in an effort to provide a double side cooling power semiconductor module capable of easily implementing an ultra-high integrated structure, and a multi-stacked power semiconductor module package using the same.

According to a preferred embodiment of the present invention, there is provided a double side cooling power semiconductor module including: a first cooler having a concave part formed in one surface thereof in a thickness direction; a first semiconductor chip mounted on the concave part of the first cooler; a second cooler having one surface and the other surface and formed on one surface of the first cooler so that one surface thereof contacts the first semiconductor chip; a circuit board formed on the other surface of the second cooler; a second semiconductor chip mounted on the circuit board; and a flexible substrate having a circuit layer electrically connecting the first and second semiconductor chips to each other.

The flexible substrate may be adhered to outer peripheral surfaces of the first and second coolers.

The double side cooling power semiconductor module may further include: a first insulation layer formed on a bottom surface of the concave part of the first cooler; and a first circuit pattern formed on the first insulation layer, wherein the first semiconductor chip is bonded to the first circuit pattern, the circuit layer of flexible substrate includes a circuit pattern and a via, and the via electrically connects the first circuit pattern and the circuit pattern to each other.

The first circuit pattern may include a gate pattern and an emitter pattern.

The double side cooling power semiconductor module may further include: a second insulation layer formed on one surface of the second cooler; and a second circuit pattern formed on the second insulation layer, wherein the first semiconductor chip is bonded to the second circuit pattern.

The second circuit pattern may be a collector pattern.

The first semiconductor chip may include an insulated gate bipolar transistor (IGBT) and a diode.

The double side cooling power semiconductor module may further include: a spacer formed between the insulation gate bipolar transistor (IGBT) and one surface of the second cooler.

The second semiconductor chip may be a control element.

Each of the first and second coolers may have at least one cooling passage formed at an inner portion thereof in a length direction.

According to another preferred embodiment of the present invention, there is provided a multi-stacked power semiconductor module package including: a 1-1th cooler having a first concave part formed in one surface thereof in a thickness direction; a 1-1th semiconductor chip mounted on the first concave part of the 1-1th cooler; a 1-2th cooler formed on one surface of the 1-1th cooler so that one surface thereof is formed with a second concave part in a thickness direction and the other surface thereof contacts the 1-1th semiconductor chip; a 1-2th semiconductor chip mounted on the second concave part of the 1-2th cooler; a second cooler having one surface and the other surface and formed on one surface of the 1-2th cooler so that one surface thereof contacts the 1-2th semiconductor chip; a circuit board formed on the other surface of the second cooler; a second semiconductor ship mounted on the circuit board; a first flexible substrate formed with a circuit layer electrically connecting the 1-1th semiconductor chip and the second semiconductor chip to each other; and a second flexible substrate formed with a circuit layer electrically connecting the 1-2th semiconductor chip and the second semiconductor chip to each other.

The first flexible substrate may be adhered to outer peripheral surfaces of the 1-1th cooler, the 1-2th cooler, and the second cooler, and the second flexible substrate may be adhered to outer peripheral surfaces of the 1-2th cooler and the second cooler.

The multi-stacked power semiconductor module package may further include: a 1-1th insulation layer formed on a bottom surface of the first concave part of the 1-1 th cooler; a 1-1 th circuit pattern formed on the 1-1th insulation layer; a 1-2th insulation layer formed on the other surface of the 1-2th cooler; and a 1-2th circuit pattern formed on the 1-2th insulation layer, wherein one surface of the 1-1th semiconductor chip is bonded to the 1-1th circuit pattern and the other surface thereof is bonded to the 1-2th circuit pattern.

The 1-1th circuit pattern may include a gate pattern and an emitter pattern, and the 1-2th circuit pattern may be a collector pattern.

The multi-stacked power semiconductor module package may further include: a 1-3th insulation layer formed on a bottom surface of the second concave part of the 1-2th cooler; a 1-3th circuit pattern formed on the 1-3th insulation layer; a second insulation layer formed on one surface of the second cooler; and a second circuit pattern formed on the second insulation layer, wherein one surface of the 1-2th semiconductor chip is bonded to the 1-3th circuit pattern and the other surface thereof is bonded to the second circuit pattern.

The 1-3th circuit pattern may include a gate pattern and an emitter pattern, and the second circuit pattern may be a collector pattern.

Each of the 1-1th and 1-2th semiconductor chips may include an insulated gate bipolar transistor (IGBT) and a diode.

The second semiconductor chip may be a control element.

Each of the 1-1th cooler, the 1-2th cooler, and the second cooler may have at least one cooling passage formed at an inner portion thereof in a length direction.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
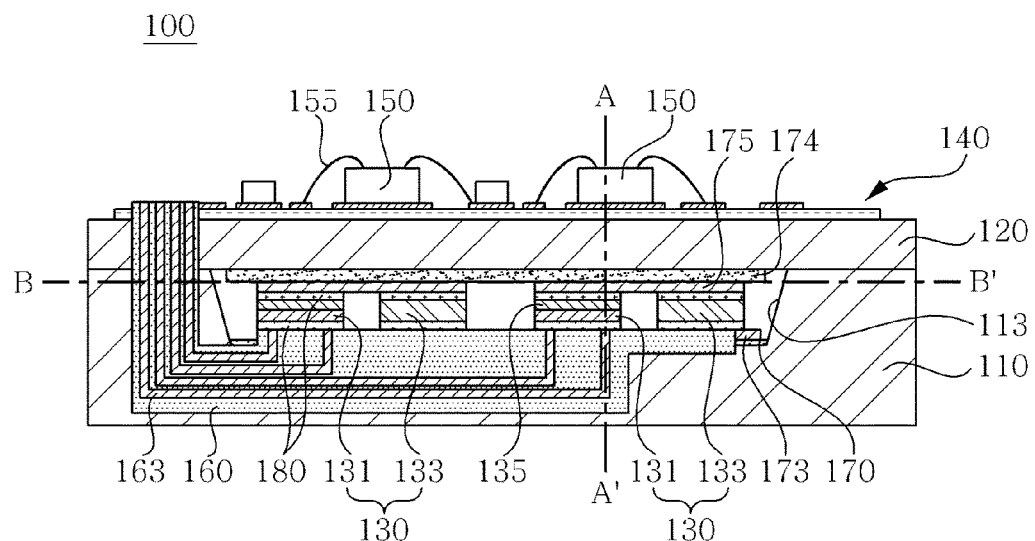
FIG. 1 is a side view showing a structure of a double side cooling power semiconductor module according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Double Side Cooling Power Module Package

Figure 2:
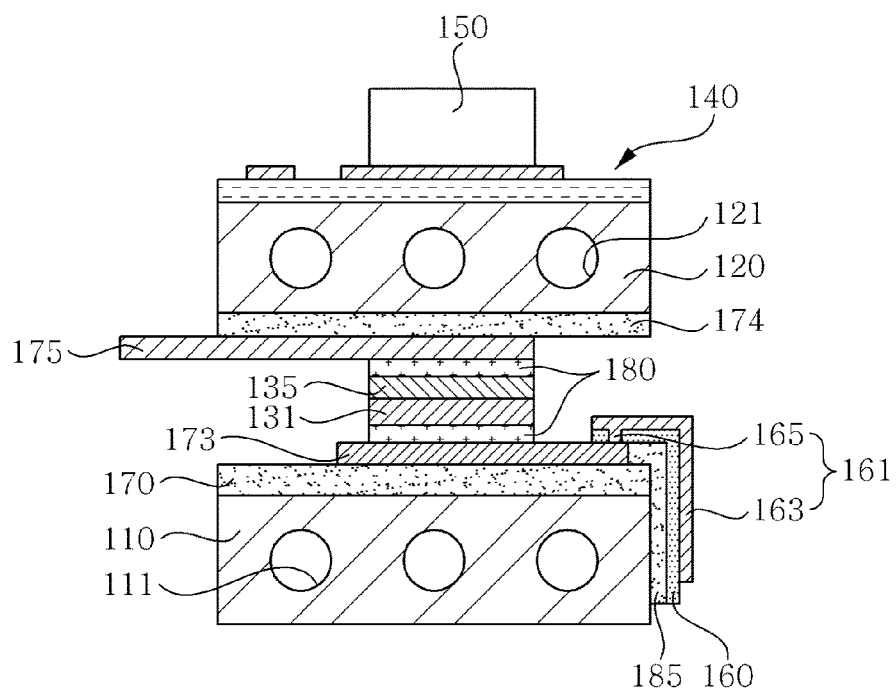
FIG. 2 is a cross-sectional view taken along the line A-A' of the double side cooling power semiconductor module shown in FIG. 1.
Figure 3:
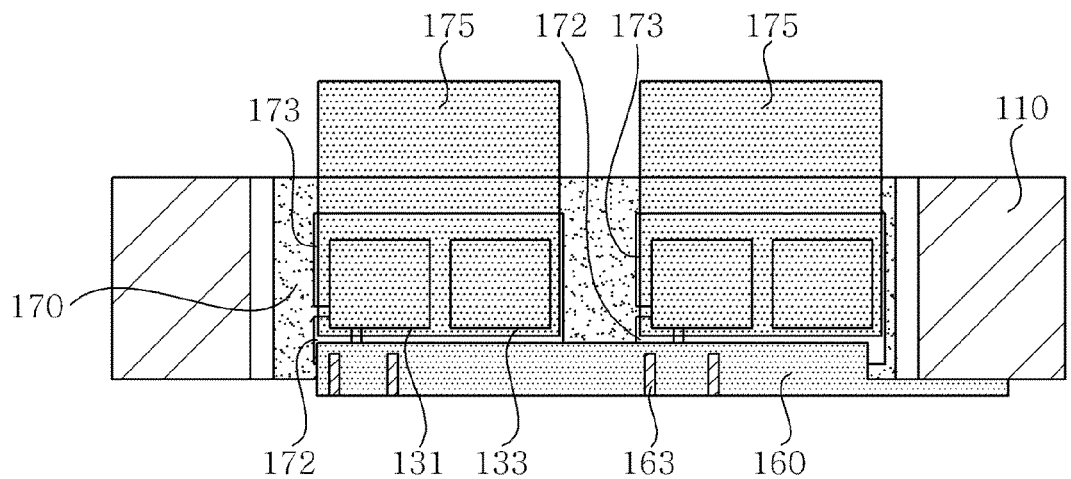
FIG. 3 is a cross-sectional view taken along the line B-B' of the double side cooling power semiconductor module shown in FIG. 1.

FIG. 1 is a side view showing a structure of a double side cooling power semiconductor module according to a preferred embodiment of the present invention; FIG. 2 is a cross-sectional view taken along the line A-A' of the double side cooling power semiconductor module shown in FIG. 1; and FIG. 3 is a cross-sectional view taken along the line B-B' of the double side cooling power semiconductor module shown in FIG. 1.

Referring to FIG. 1, the double side cooling power semiconductor module 100 according to the preferred embodiment of the present invention may be configured to include a first cooler 110 having a concave part 113 formed in one surface thereof in a thickness direction, a first semiconductor chip 130 mounted on the concave part 113 of the first cooler 110, a second cooler 120 having one surface and the other surface and formed on one surface of the first cooler 110 so that one surface thereof contacts the first semiconductor chip 130, a circuit board 140 formed on the other surface of the second cooler 120, a second semiconductor chip 150 mounted on the circuit board 140, and a flexible substrate 160 having a circuit layer 161 electrically connecting the first and second semiconductor chips 130 and 150 to each other.

In the present embodiment, the first and second coolers 110 and 120 may be made of a material having high thermal conductivity, for example, a metal material, in order to improve heat radiation characteristics, but is not particularly limited thereto.

Further, in the present embodiment, an inner portion of the first cooler 110 may be formed with a pipe shaped cooling passage 111 through which a refrigerant may move, as shown in FIG. 2. In this case, the refrigerant may be liquid or air, but is not particularly limited thereto.

In the present embodiment, as shown in FIG. 1, the first cooler 110 may have the concave part 113 formed in one surface thereof in the thickness direction, and the concave part 113 may have the first semiconductor chip 130 mounted thereon.

In the present embodiment, a bottom surface of the concave part 113 may be formed with an insulation layer 170 (hereinafter, referred to as a first insulation layer) on which a circuit pattern 171 (hereinafter, referred to as a first circuit pattern) may be formed, and the first semiconductor chip 130 may be bonded to the first circuit pattern 171 to thereby be mounted on the concave part 113.

Here, the first semiconductor chip 130 and the first circuit pattern 171 may be bonded to each other using a solder, but is not particularly limited thereto. In addition, the first insulation layer 170 may be made of an insulating material, such as a ceramic, a resin, or the like, but is not particularly limited thereto.

In addition, the first circuit pattern 171 may be made of copper (Cu), nickel (Ni), silver (Ag), or gold (Au), but is not particularly limited thereto. In the present embodiment, the first circuit pattern 171 may be formed by a chemical vapor deposition (CVD) method, a physical vapor deposition (PVD) method, an electroplating process, an electroless plating process, or a sputtering process, but is not particularly limited thereto. It may be appreciated by those skilled in the art that all known processes of forming a metal layer may be used.

In the present embodiment, the first circuit pattern 171 may include a gate pattern 172 and an emitter pattern 173.

Further, in the present embodiment, the first semiconductor chip 130 may include an insulated gate bipolar transistor (IGBT) 131 and a diode 133, but is not particularly limited thereto.

Generally, the insulated gate bipolar transistor (IGBT) 131 has gate and emitter terminals formed on one surface thereof and a collector terminal formed on the other surface thereof, and the diode 133 has an anode terminal formed on one surface thereof and a cathode terminal formed on the other surface thereof.

Therefore, in the present embodiment, the first circuit pattern 171, that is, each of the gate pattern 172 and the emitter pattern 173 may be formed so as to correspond to positions of the gate and emitter terminals formed on one surface of the insulated gate bipolar transistor (IGBT) 131, and the insulated gate bipolar transistor (IGBT) 131 may be mounted so that one surface thereof (a surface on which the gate and emitter terminals are formed) contacts the first circuit pattern 171.

Likewise, the diode 133 may be also mounted so that one surface thereof, that is, a surface on which the anode terminal is formed contacts the first circuit pattern 171.

In the present invention, the second cooler 120 may have a plate shape and be made of a material having high thermal conductivity, for example, a metal material, but is not particularly limited thereto.

As shown in FIG. 1, the second cooler 120 may be formed on one surface of the first cooler 110 so as to cover the concave part 113 and have one surface contacting the first semiconductor chip 130 and the other surface formed with the circuit board 140.

In addition, an inner portion of the second cooler 120 may be formed with at least one pipe shaped cooling passage 121 through which a refrigerant moves, similarly to the above-mentioned first cooler 110.

Further, one surface, that is, a surface contacting the first semiconductor chip 130, of the second cooler 120 may be formed with a second insulation layer 174 on which a second circuit pattern 175 may be formed.

Here, the second circuit pattern 175 may be formed by bonding a metal plate or a metal lead frame to the second insulation layer 174 and be used as a collector pattern. In this case, the metal plate or the metal lead frame may be made of copper (Cu), aluminum (Al), and iron (Fe), but is not particularly limited thereto.

Therefore, the second circuit pattern 175 may be bonded to the other surface (a surface on which the collector terminal is formed) of the insulated gate bipolar transistor (IGBT) 131 and the other surface (a surface on which the cathode terminal is formed) of the diode 133. In this case, the bonding may be performed using a solder 180, but is not particularly limited thereto.

Further, in the present embodiment, the second circuit pattern 175 and the insulated gate bipolar transistor (IGBT) 131 may have a spacer 135 formed therebetween.

Here, the spacer 135, which is formed in order to match heights of the insulated gate bipolar transistor (IGBT) 131 and the diode 133 to each other, may be formed at the insulated gate bipolar transistor (IGBT) 131 side since a thickness of the insulated gate bipolar transistor (IGBT) 131 is generally smaller than that of the diode 133.

That is, the spacer 135 is formed in order to allow a height of the entire module to be uniform. Here, the spacer 135 may be made of a metal, but is not particularly limited thereto. That is, the spacer 135 may be made of any conductive material.

More specifically, one surface of the spacer 135 described above is bonded to the other surface (the surface on which the collector terminal is formed) of the insulated gate bipolar transistor (IGBT) 131, and the other surface thereof contacts the second circuit pattern 175.

Here, the bonding may be performed by the solder 180, but is not particularly limited thereto.

As described above, each of the first and second coolers 110 and 120 contacts both surfaces of the first semiconductor chip 130 having a high heat generation amount, thereby making it possible to simultaneously transfer heat generated from the first semiconductor chip 130 to both of the first and second coolers 110 and 120 to effectively radiate the heat.

Further, in the present embodiment, the second semiconductor chip 150, which is a control element for controlling the driving of the first semiconductor chip 130, is provided. This second semiconductor chip 150 may be mounted on the circuit board 140 formed on the other surface of the second cooler 120.

Here, the second semiconductor chip 150 may be electrically connected to the circuit board 140 in a wire 155 scheme as shown in FIG. 1, but is not particularly limited thereto. That is, the second semiconductor 150 may be also mounted on the circuit board 140 in a flip-chip scheme.

Further, in the present embodiment, in order to electrically connect the first semiconductor chip 130 and the second semiconductor chip 150 to each other, the flexible substrate 160 may be used.

In the present embodiment, the flexible substrate 160, which is to transfer a driving signal from the control element to the gate and emitter terminals of the insulated gate bipolar transistor (IGBT) 131 and the anode terminal of the diode 133, serves to connect a wiring of the circuit board 140 mounted with the second semiconductor chip 150, which is the control element, and the first circuit pattern 171 including the gate pattern 172 and the emitter pattern 173 to each other.

The flexible substrate 160 may be a double sided substrate on which the circuit layer 161 including a circuit pattern 163 and a via 165 is formed, and the wiring of the circuit board 140 and the gate and emitter patterns 172 and 173 may be electrically connected to each other through the via 165.

That is, the wiring and the first circuit pattern 171 are electrically connected to each other through the circuit pattern 163 formed on the flexible substrate 160 by bonding the via 165 to the wiring and the first circuit pattern 171.

Here, the bonding may be performed using a solder, a conductive epoxy, or the like, but is not particularly limited thereto.

Further, in the present embodiment, the width or the number of circuit patterns 163 formed on the flexible substrate 160 may be adjusted according to current capacities of the gate and the emitter.

Further, as shown in FIGS. 1 and 2, the flexible substrate 160 may be adhered to outer peripheral surfaces of the first and second coolers 110 and 120 in the present embodiment.

In this case, an adhesive member 185 may be used for adhesion. Here, the adhesive member 185 may be made of a thermal conductive adhesive, but is not particularly limited thereto.

As described above, the flexible substrate 160 is adhered and fixed to the outer peripheral surfaces of the first and second coolers 110 and 120 to prevent vibration, deformation or movement capable of being generated during a process, thereby making it possible to improve reliability and a yield of the module.

In addition, although not shown in the accompanying drawings related to the present embodiment, the second circuit pattern 175 formed on the second insulation layer 174 may be connected to a power supply through a bus bar.

Multi-Stacked Power Semiconductor Module Package

Figure 4:
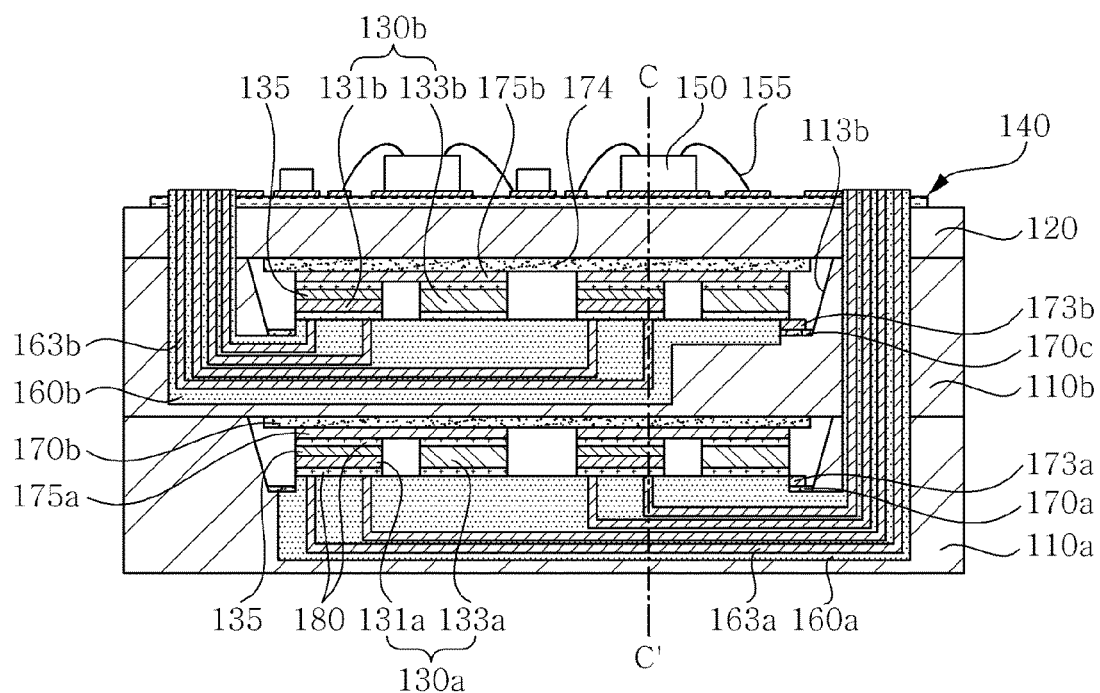
FIG. 4 is a cross-sectional view showing a structure of a multi-stacked power semiconductor module package according to the preferred embodiment of the present invention.
Figure 5:
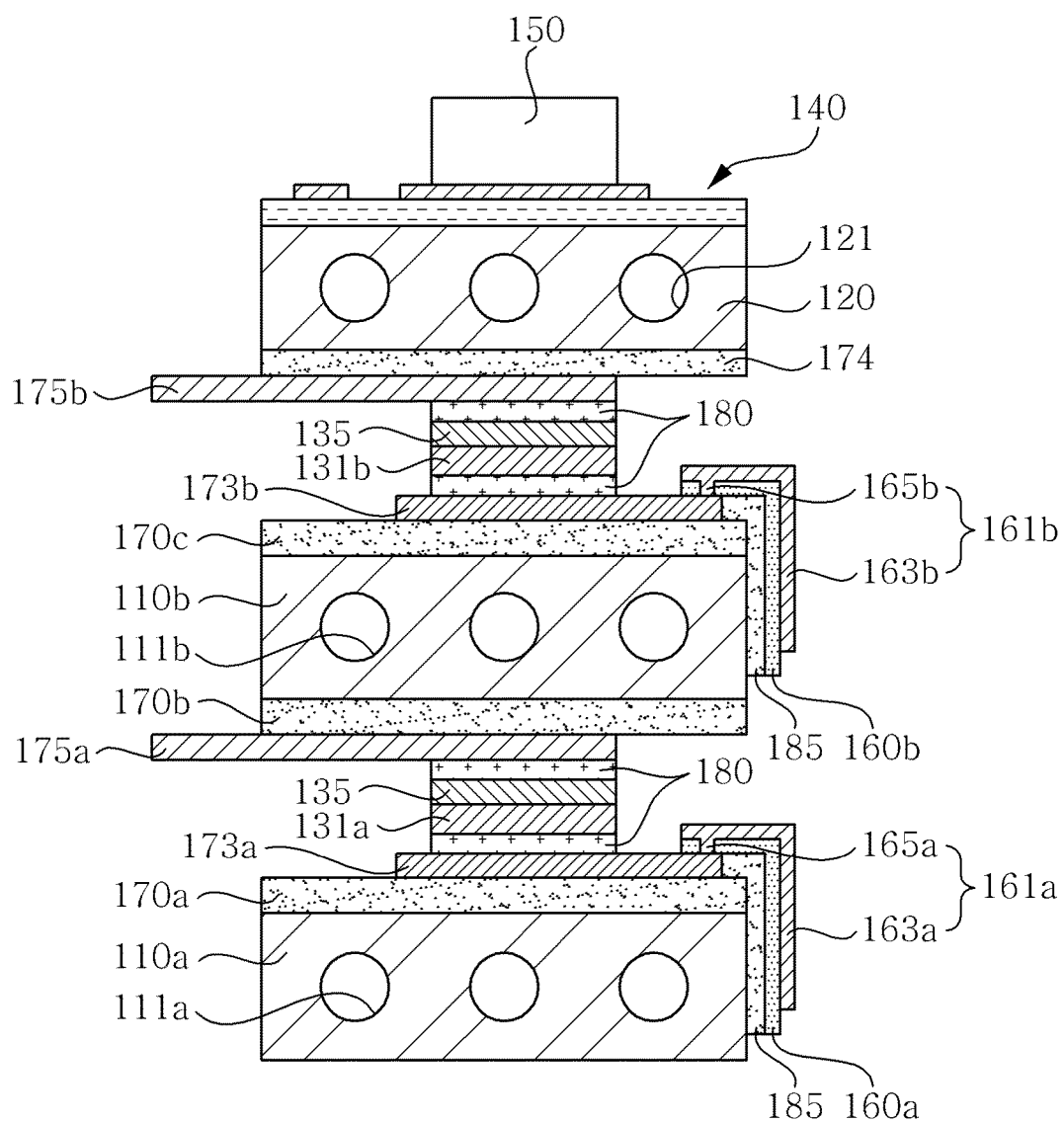
FIG. 5 is a cross-sectional view taken along the line C-C' of the multi-stacked power semiconductor module package shown in FIG. 4.

FIG. 4 is a cross-sectional view showing a structure of a multi-stacked power semiconductor module package according to the preferred embodiment of the present invention; and FIG. 5 is a cross-sectional view taken along the line C-C' of the multi-stacked power semiconductor module package shown in FIG. 4.

In the present embodiment, a description of components overlapped with those of the double side cooling power semiconductor module described above will be omitted, and the same reference numerals will be used to describe the same components.

Referring to FIG. 4, the multi-stacking power semiconductor module package 200 according to the present embodiment may be configured to include a 1-1th cooler 110a having a first concave part 113a formed in one surface thereof in a thickness direction, a 1-1th semiconductor chip 130a mounted on the first concave part 113a of the 1-1th cooler 110a, a 1-2th cooler 110b formed on one surface of the 1-1th cooler 110a so that one surface is formed with a second concave part 113b in a thickness direction and the other surface thereof contacts the 1-1th semiconductor chip 130a, a 1-2th semiconductor chip 130b mounted on the second concave part 113b of the 1-2th cooler 110b, a second cooler 120 having one surface and the other surface and formed on one surface of the 1-2th cooler 110b so that one surface thereof contacts the 1-2th semiconductor chip 130b, a circuit board 140 formed on the other surface of the second cooler 120, a second semiconductor ship 150 mounted on the circuit board 140, a first flexible substrate 160a formed with a circuit layer 161a electrically connecting the 1-1th semiconductor chip 130a and the second semiconductor chip 150 to each other, and a second flexible substrate 160b formed with a circuit layer 161b electrically connecting the 1-2th semiconductor chip 130b and the second semiconductor chip 150 to each other.

In the present embodiment, the first flexible substrate 160a may be adhered to outer peripheral surfaces of the 1-1th cooler 110a, the 1-2th cooler 110b, and the second cooler 120, and the second flexible substrate 160b may be adhered to outer peripheral surfaces of the 1-2th cooler 110b and the second cooler 120.

In this case, an adhesive member 185 may be used for adhesion. Here, the adhesive member 185 may be made of a thermal conductive adhesive, but is not particularly limited thereto.

That is, although a multi-stacked package form in which a plurality of coolers disclosed in the double side cooling power semiconductor module described above and having the first semiconductor chip mounted thereon are stacked is suggested in the present embodiment and a form in which two coolers having the first semiconductor chip mounted thereon are stacked is shown in FIGS. 4 and 5, the present invention is not limited thereto. That is, it is appreciated by those skilled in the art that three or more coolers may also be stacked.

In the present embodiment, the 1-1th cooler 110a, the 1-2th cooler 110b, and the second cooler 120 may be made of a material having high thermal conductivity, for example, a metal, or the like, but is not particularly limited thereto.

In addition, each of inner portions of the 1-1th cooler 110a, the 1-2th cooler 110b, and the second cooler 120 may be provided with cooling passages 111a, 111b, and 121 through which a refrigerant moves.

Further, in the present embodiment, a 1-1th insulation layer 170a and a 1-1th circuit pattern 171a may be formed on the first concave part 113a of the 1-1th cooler 110a, a 1-2th insulation layer 170b and a 1-2th circuit pattern 175a may be formed on the other surface of the 1-2th cooler 110b and a 1-3th insulation layer 170c and a 1-3th circuit pattern 171b may be formed on the second concave part 113b thereof, and a second insulation layer 174 and a second circuit pattern 175b may be formed on one surface of the second cooler 120.

Here, the 1-1th circuit pattern 171a and the 1-3th circuit pattern 171b may include a gate pattern and an emitter pattern, and the 1-2th circuit pattern 175a and the second circuit pattern 175b may be a collector pattern.

The circuit board 140 formed on the second cooler 120 is mounted with the second semiconductor chip 150. This second semiconductor chip 150 may be connected to the circuit board 140 by wire 155 bonding, but is not particularly limited thereto.

In the present embodiment, the first flexible substrate 160a is formed in order to electrically connect the 1-1th semiconductor chip 130a and the second semiconductor chip 150 to each other, and the second flexible substrate 160b is formed in order to electrically connect the 1-2th semiconductor chip 130b and the second semiconductor chip 150 to each other. Here, the 1-1th semiconductor chip 130a and the 1-2th semiconductor chip 130b may be a power element including an insulated gate bipolar transistor (IGBT) and a diode and the second semiconductor chip may be a control element for controlling the driving of the above-mentioned power element.

Although the case in which the power element is stacked in a multilayer form and the control element driving the power element is formed in a single layer form is shown in FIGS. 4 and 5, the control element may also be formed in a multilayer form, as needed.

As described above, a multilayer stacked structure of the power element is implemented, the power element and the control element are electrically connected to each other using the flexible substrate, and the flexible substrate is adhered and fixed to the outer peripheral surface of the cooler, thereby making it possible to accomplish high integration, miniaturization, and lightness of the power semiconductor module package.

As set forth above, according to the preferred embodiments of the present invention, a structure in which the coolers contact both surfaces of the semiconductor chip is used to maximize cooling efficiency, thereby making it possible to improve heat radiation characteristics.

In addition, according to the preferred embodiments of the present invention, the electrical circuit wiring is integrated with the cooler to reduce a thermal resistance interface, thereby making it possible to significantly improve heat radiation characteristics.

Further, according to the preferred embodiments of the present invention, the coolers in which the semiconductor chip is mounted are stacked to be integrated with each other, thereby making it possible to easily implement high integration, miniaturization, and lightness of the power module package.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A double side cooling power semiconductor module comprising:
   a first cooler having a concave part formed in one surface thereof in a thickness direction;
   a first semiconductor chip mounted on the concave part of the first cooler;
   a second cooler having one surface and the other surface and formed on one surface of the first cooler so that one surface thereof contacts the first semiconductor chip;
   a circuit board formed on the other surface of the second cooler;

a second semiconductor chip mounted on the circuit board; and a flexible substrate having a circuit layer electrically connecting the first and second semiconductor chips to each other.

2. The double side cooling power semiconductor module as set forth in claim 1, wherein the flexible substrate is adhered to outer peripheral surfaces of the first and second coolers.

3. The double side cooling power semiconductor module as set forth in claim 1, further comprising:
a first insulation layer formed on a bottom surface of the concave part of the first cooler; and
a first circuit pattern formed on the first insulation layer,
wherein the first semiconductor chip is bonded to the first circuit pattern,
the circuit layer of flexible substrate includes a circuit pattern and a via, and
the via electrically connects the first circuit pattern and the circuit pattern to each other.

4. The double side cooling power semiconductor module as set forth in claim 3, wherein the first circuit pattern includes a gate pattern and an emitter pattern.

5. The double side cooling power semiconductor module as set forth in claim 1, further comprising:
a second insulation layer formed on one surface of the second cooler; and
a second circuit pattern formed on the second insulation layer,
wherein the first semiconductor chip is bonded to the second circuit pattern.

6. The double side cooling power semiconductor module as set forth in claim 5, wherein the second circuit pattern is a collector pattern.

7. The double side cooling power semiconductor module as set forth in claim 1, wherein the first semiconductor chip includes an insulated gate bipolar transistor (IGBT) and a diode.

8. The double side cooling power semiconductor module as set forth in claim 7, further comprising a spacer formed between the insulation gate bipolar transistor (IGBT) and one surface of the second cooler.

9. The double side cooling power semiconductor module as set forth in claim 1, wherein the second semiconductor chip is a control element.

10. The double side cooling power semiconductor module as set forth in claim 1, wherein each of the first and second coolers has at least one cooling passage formed at an inner portion thereof in a length direction.

11. A multi-stacked power semiconductor module package comprising:
a 1-1th cooler having a first concave part formed in one surface thereof in a thickness direction;
a 1-1th semiconductor chip mounted on the first concave part of the 1-1th cooler;
a 1-2th cooler formed on one surface of the 1-1th cooler so that one surface thereof is formed with a second concave part in a thickness direction and the other surface thereof contacts the 1-1th semiconductor chip;
a 1-2th semiconductor chip mounted on the second concave part of the 1-2th cooler;
a second cooler having one surface and the other surface and formed on one surface of the 1-2th cooler so that one surface thereof contacts the 1-2th semiconductor chip;
a circuit board formed on the other surface of the second cooler;
a second semiconductor ship mounted on the circuit board;
a first flexible substrate formed with a circuit layer electrically connecting the 1-1th semiconductor chip and the second semiconductor chip to each other; and
a second flexible substrate formed with a circuit layer electrically connecting the 1-2th semiconductor chip and the second semiconductor chip to each other.

12. The multi-stacked power semiconductor module package as set forth in claim 11, wherein the first flexible substrate is adhered to outer peripheral surfaces of the 1-1th cooler, the 1-2th cooler, and the second cooler.

13. The multi-stacked power semiconductor module package as set forth in claim 11, wherein the second flexible substrate is adhered to outer peripheral surfaces of the 1-2th cooler and the second cooler.

14. The multi-stacked power semiconductor module package as set forth in claim 11, further comprising:
a 1-1th insulation layer formed on a bottom surface of the first concave part of the 1-1th cooler;
a 1-1th circuit pattern formed on the 1-1th insulation layer;
a 1-2th insulation layer formed on the other surface of the 1-2th cooler; and
a 1-2th circuit pattern formed on the 1-2th insulation layer,
wherein one surface of the 1-1th semiconductor chip is bonded to the 1-1th circuit pattern and the other surface thereof is bonded to the 1-2th circuit pattern.

15. The multi-stacked power semiconductor module package as set forth in claim 14, wherein the 1-1th circuit pattern includes a gate pattern and an emitter pattern, and the 1-2th circuit pattern is a collector pattern.

16. The multi-stacked power semiconductor module package as set forth in claim 11, further comprising:
a 1-3th insulation layer formed on a bottom surface of the second concave part of the 1-2th cooler;
a 1-3th circuit pattern formed on the 1-3th insulation layer;
a second insulation layer formed on one surface of the second cooler; and
a second circuit pattern formed on the second insulation layer,
wherein one surface of the 1-2th semiconductor chip is bonded to the 1-3th circuit pattern and the other surface thereof is bonded to the second circuit pattern.

17. The multi-stacked power semiconductor module package as set forth in claim 16, wherein the 1-3th circuit pattern includes a gate pattern and an emitter pattern, and the second circuit pattern is a collector pattern.

18. The multi-stacked power semiconductor module package as set forth in claim 11, wherein each of the 1-1th and 1-2th semiconductor chips includes an insulated gate bipolar transistor (IGBT) and a diode.

19. The multi-stacked power semiconductor module package as set forth in claim 11, wherein the second semiconductor chip is a control element.

20. The multi-stacked power semiconductor module package as set forth in claim 11, wherein each of the 1-1th cooler, the 1-2th cooler, and the second cooler has at least one cooling passage formed at an inner portion thereof in a length direction.

* * * * *